United States Patent
McKenna et al.

(10) Patent No.: US 7,642,940 B1
(45) Date of Patent: *Jan. 5, 2010

(54) OBSOLESCENCE MITIGATION FOR PROGRAMMABLE WAVEFORM DIGITIZERS

(75) Inventors: James McKenna, Bohemia, NY (US); Robert M. Buckley, Medford, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 34 days.

This patent is subject to a terminal disclaimer.

(21) Appl. No.: 12/031,140

(22) Filed: Feb. 14, 2008
(Under 37 CFR 1.47)

Related U.S. Application Data

(63) Continuation-in-part of application No. 11/521,223, filed on Sep. 14, 2006, now Pat. No. 7,358,877.

(60) Provisional application No. 60/726,015, filed on Oct. 12, 2005.

(51) Int. Cl.
  *H03M 1/10* (2006.01)
(52) U.S. Cl. .................. 341/120; 341/118; 341/155
(58) Field of Classification Search ................ 341/120
See application file for complete search history.

(56) References Cited

U.S. PATENT DOCUMENTS

| | | | |
|---|---|---|---|
| 4,005,408 A | 1/1977 | Taylor et al. | |
| 4,227,187 A | 10/1980 | McNamara et al. | |
| 4,647,909 A | 3/1987 | Spalding | |
| 5,185,571 A | 2/1993 | Brust | |
| 6,356,221 B1 | 3/2002 | LeChevalier | |
| 6,480,242 B1 | 11/2002 | Okada et al. | |
| 7,146,283 B2 | 12/2006 | Daigle et al. | |
| 7,358,877 B1 * | 4/2008 | Buckley et al. | 341/120 |

* cited by examiner

*Primary Examiner*—Khai M Nguyen
(74) *Attorney, Agent, or Firm*—Brian Roffe

(57) ABSTRACT

Method for enabling use of the same, existing test programs for both an obsolete and new waveform digitizer, each having an analog input interface and a digital output interface, entails providing an automatic test equipment for hosting test programs for using a waveform digitizer, and determining scalers and low voltage monolithic analog-to-digital converters to couple to the analog input interface and digital output interface of the new waveform digitizer. As such, the new waveform digitizer provides the same function, or has the same functionality as, as the obsolete waveform digitizer, and the same, existing test programs can be used for the new waveform digitizer as were used for the obsolete waveform digitizer.

20 Claims, 5 Drawing Sheets

100

PRIOR ART

PRIOR ART

OBSOLESCENCE MITIGATION FOR PROGRAMMABLE WAVEFORM DIGITIZERS

CROSS-REFERENCE TO RELATED APPLICATIONS

This application is a continuation-in-part of U.S. patent application Ser. No. 11/521,223 filed Sep. 14, 2006, now U.S. Pat. No. 7,358,877, which claims priority under 35 U.S.C. §119(e) of U.S. provisional patent application Ser. No. 60/726,015 filed Oct. 12, 2005, now expired, both of which are incorporated by reference herein.

FIELD OF INVENTION

The present invention relates generally to the field of automatic test equipment for testing electronic signals generated by equipment under test including digitized waveforms. More specifically, the present invention relates to a hardware methodology for replacing obsolete waveform digitizers used for analog-digital conversion while enabling use of the same, existing test programs by automatic test equipment as were used for the obsolete waveform digitizer.

BACKGROUND OF INVENTION

Automatic test equipment for the testing and measurement of electronic signals and waveforms is known. Frequently, existing test instrumentation utilizes hardware components that have become obsolete and unmaintainable. The cost to replace the entire test instrument is typically very high due to its impact on test and software applications. Additionally, maintenance of the test instrument's original designed components to extend service life is limited due to obsolescence and reliability issues experienced with older technology. All these issues prohibit utilization for limited budgeted systems.

In some test instrumentation, Electron Bombarded Semiconductor (EBS) tubes are used for analog-digital conversion. As with other test instrument components, these EBS tubes are also subject to obsolescence.

One methodology used to extend service life and mitigate the issues of obsolescence and reliability is to replace the special Electron Bombarded Semiconductor (EBS) Tubes with current technology that is functionally the same yet reliably superior. By utilizing new technology, the overall cost of maintaining the test instrument is reduced while utilization is enhanced. Applied to multiple systems where the instrument is used, the benefits are profound.

To provide an understanding of the application of the invention, FIG. 1 shows major subsystems of a prior art automatic test equipment capable of measuring waveforms via programmable by digitization. Specifically, FIG. 1 shows a block diagram of an IATS Programmable Waveform Digitizer 100 in which the major functional subsystems, aside from an analog-to-digital conversion subsystem, are shown. One skilled in the art would be readily able to ascertain the manner in which the waveform digitizer 100 operates and the function of each subsystem.

As the invention relates in particular to an analog-to-digital conversion block for such a programmable waveform digitizer 100, the prior art analog-to-digital conversion (ADC) block is shown in FIG. 2 and designated generally as 102. ADC block 102 includes, for each of Channel A Input and Channel B input thereto, an EBS tube 104.

In a manner known to those skilled in the art, the EBS tubes 104 are used to perform analog-to-digital conversion. One special EBS tube for this purpose is an electron tube with a silicon target, an electron gun, focus lenses and alignment plates using a 10-kilovolt beam to convert an input analog signal to a digital format. The tube requires a high voltage supply to develop the 10-kilovolt beam and precise alignment in order to accurately perform the analog-to-digital conversion. Additionally, skilled technical personal are required to periodically perform a detailed calibration procedure.

Each EBS tube 104 interfaces with a deflection amplifier 106 and a clock buffer 108 which provides a strobe for sampling, for example, at five nanosecond intervals (200 Mps) (see FIG. 1). The deflection amplifiers 106 provide analog input for sampling by the EBS tubes 104. A high voltage supply 110 is also provided as either part of the ADC block 102 or one of the subsystems in the programmable waveform digitizer 100. The high voltage power supply 110 provides the voltage required to develop a 10-kilovolt beam to convert an input analog signal into digital form. The programmable waveform digitizer 100 also includes a data memory interface component 112 which receives the Channel A and B data from the ADC block 102. Data memory interface component 112 is typically constructed to be capable of storing 8 bit gray coded outputs.

As discussed above, since the EBS tubes 104 are therefore obsolete, it would be desirable to replace them, and ideally the entire ADC block 102 containing them.

OBJECTS AND SUMMARY OF INVENTION

It is an object of the present invention to provide new and improved automatic test equipment for testing electronic signals generated by equipment under test including digitized waveforms.

It is another object of the present invention to provide a new hardware methodology for replacing obsolete and unmaintainable Electron Bombarded Semiconductor (EBS) tubes used for analog-digital conversion in automatic test equipment while enabling use of the same, existing test programs.

It is yet another object of the present invention to provide a new method for nullifying the obsolescence of Electron Bombarded Semiconductor (EBS) tubes used for analog-digital conversion in automatic test equipment by replacing the entire analog-to-digital conversion block containing such EBS tubes.

In order to achieve one or more of these objects and possibly others, a method for enabling use of the same, existing test programs for both an obsolete and new waveform digitizer, each having an analog input interface and a digital output interface, entails providing an automatic test equipment (ATE) for hosting test programs for using a waveform digitizer, determining scalers and low voltage monolithic analog-to-digital converters (ADCs) to couple to the analog input interface and digital output interface of the new waveform digitizer such that the new waveform digitizer provides the same function, or has the same functionality as, as the obsolete waveform digitizer, and continuing use of the same, existing test programs for the new waveform digitizer as were used for the obsolete waveform digitizer. In some embodiments, the ADCs may be mounted on a printed circuit board which may also include scalers arranged so that possibly, each ADC is connected to a respective scaler. Furthermore, in some embodiments, the ADCs and associated circuitry may be designed to provide on-chip calibration and a built-in test ability.

Another method in accordance with the invention is for mitigating obsolescence of an obsolete waveform digitizer including Electron Bombarded Semiconductor (EBS) tubes, an analog input interface and a digital output interface, with the EBS tubes being interposed between the analog input interface and the digital output interface. This method entails coupling an automatic test equipment (ATE) to the obsolete waveform digitizer, providing the ATE with test programs for using the obsolete waveform digitizer, coupling a new waveform digitizer to the ATE instead of the obsolete waveform digitizer, providing the new waveform digitizer with scalers and low voltage monolithic analog-to-digital converters (ADCs) coupled to the analog input interface and the digital output interface, determining the scalers and ADC's to couple to the analog input interface and digital output interface such that the scalers and ADC's in the new waveform digitizer provide the same function as the EBS tubes in the obsolete waveform digitizer, and continuing use of the same, existing test programs for the new waveform digitizer as were used for the obsolete waveform digitizer.

Another method in accordance with the invention utilize utilizes an automatic test equipment (ATE) with test programs for commanding a waveform digitizer to enable use of the same, existing test programs for both an obsolete waveform digitizer and a new waveform digitizer, each having an analog input interface and a digital output interface. The method entails determining scalers and low voltage monolithic analog-to-digital converters (ADCs) to couple to the analog input interface and digital output interface of the new waveform digitizer such that the new waveform digitizer provides the same function as the obsolete waveform digitizer, and then continuing utilization of the same, existing test programs by the ATE for the new waveform digitizer as were used for the obsolete waveform digitizer.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
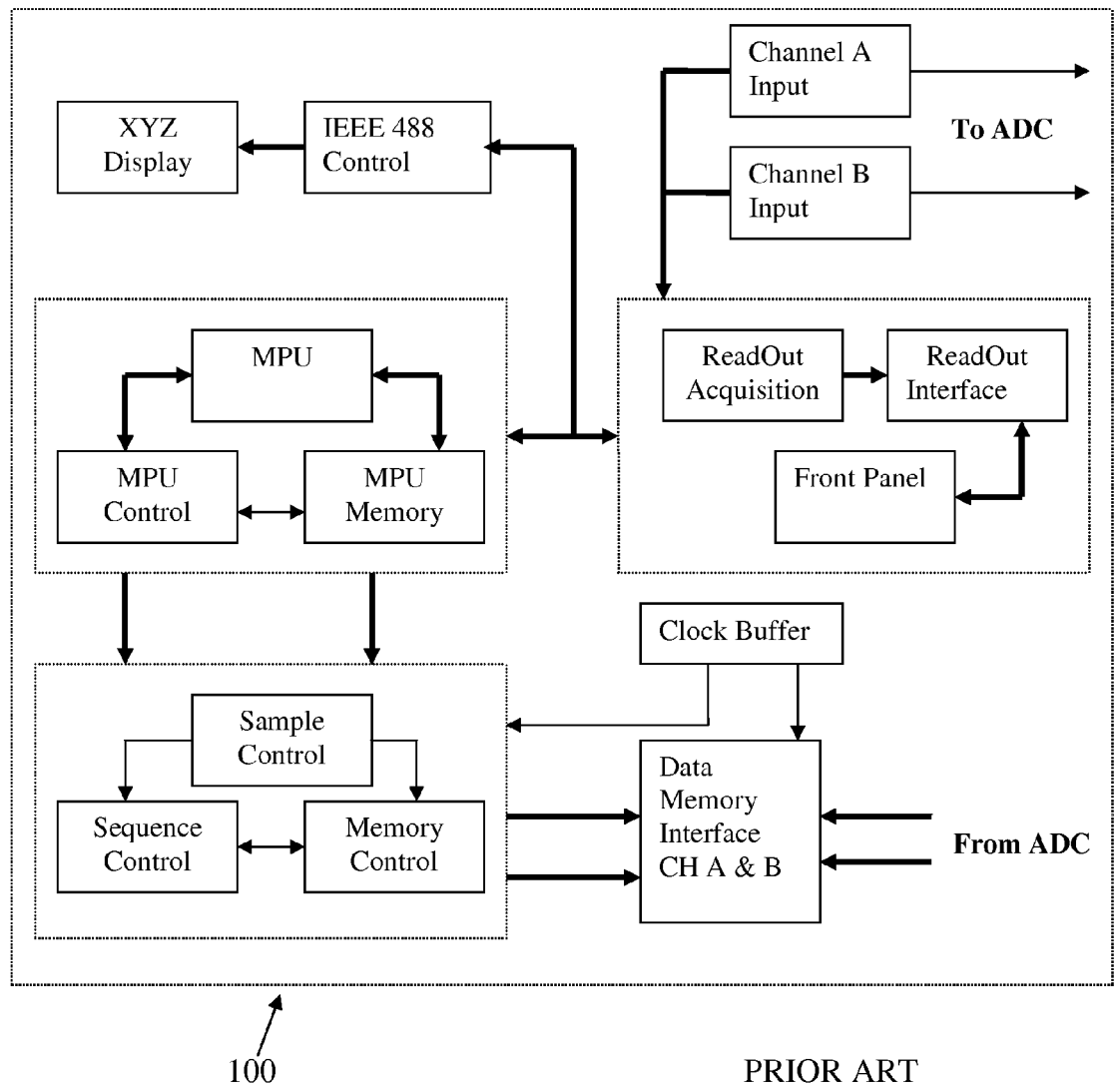
FIG. 1 is a prior art programmable waveform digitizer block diagram of functional subsystems showing input and data arrows for an analog-to-digital conversion subsystem.
Figure 2:
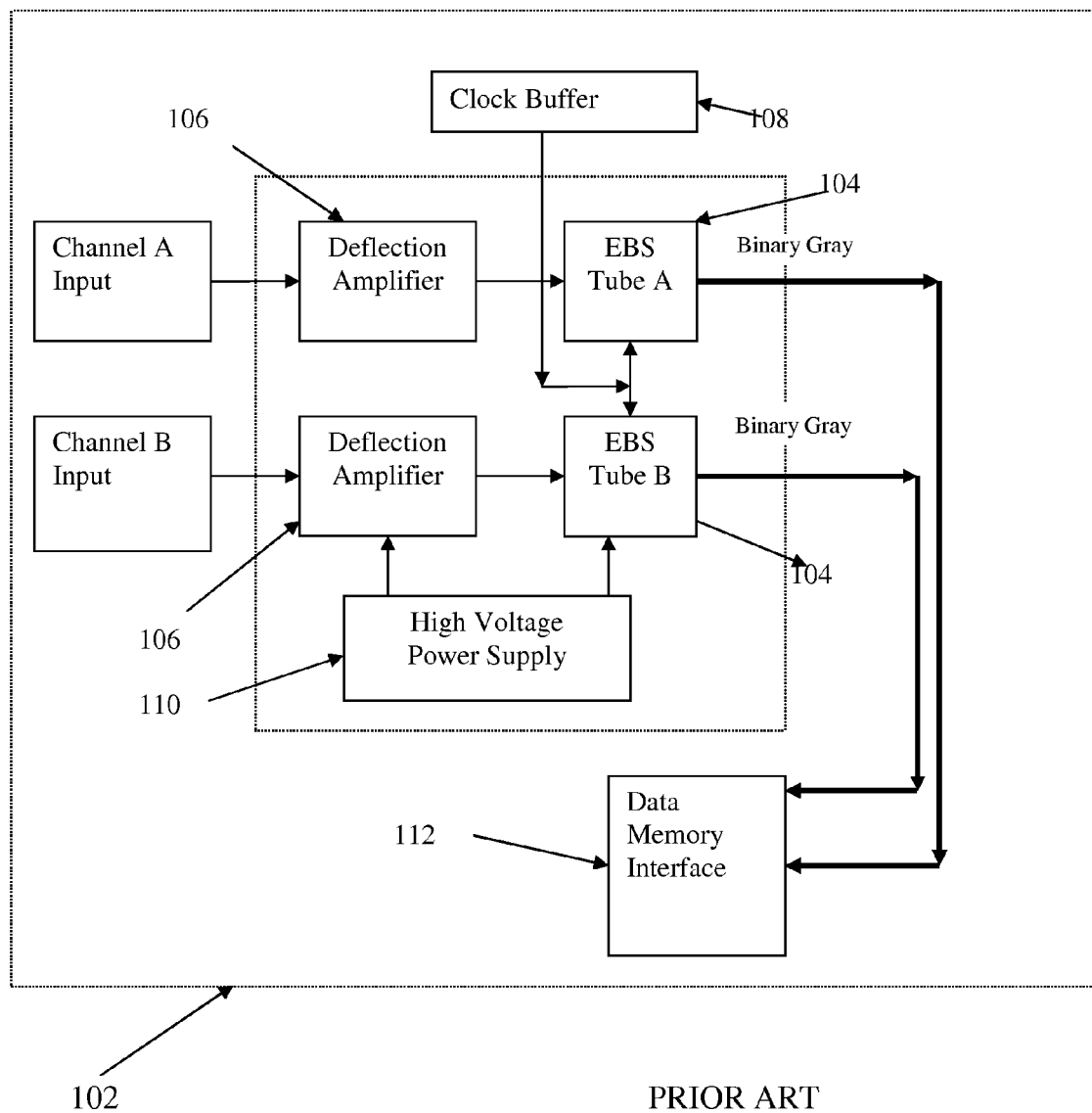
FIG. 2 is a block diagram of an analog-to-digital conversion subsystem using high voltage EBS tubes for use in combination with the subsystems of the programmable waveform digitizer shown in FIG. 1.
Figure 3:
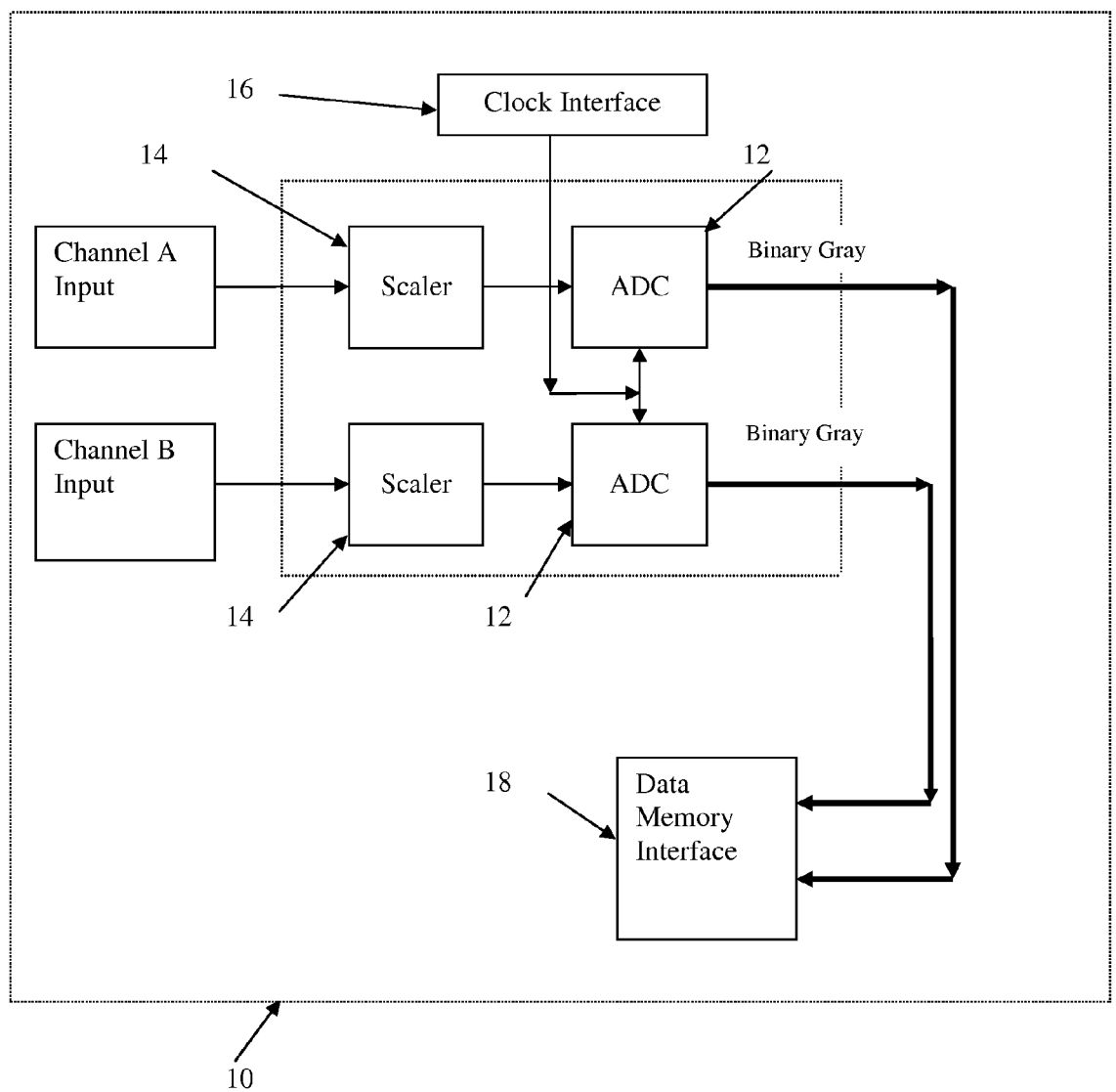
FIG. 3 is a block diagram of an analog-to-digital conversion subsystem in accordance with the invention for use in combination with the subsystems of the programmable waveform digitizer shown in FIG. 1.

Referring to FIG. 3, an analog-to-digital conversion (ADC) block in accordance with the invention for use in combination with the subsystems of the programmable waveform digitizer 100 shown in FIG. 1 is designated generally as 10 and includes components which replace and substitute for the ADC block 102 shown in FIG. 2.

Specifically, the ADC block 10 in accordance with the invention replaces each EBS tube 102 with a monolithic analog-to-digital converter (ADC) 12 and preferably an associated scaler 14. Each scaler 14 establishes a full scale deflection function between the analog input and the ADC 12. Each monolithic ADC 12 is preferably a dual 8 bit ADC which samples at 200 Msps and outputs a digitized signal in gray code format. The ADC 12 provides for on-chip calibration and a Built-In-Test eliminates the need for alignment. The clock and data memory interfaces provide the required logic level translation for communication with their respective subsystem.

Each ADC 12 interfaces with the same subsystems in the waveform digitizer as the replaced EBS tube 102, i.e., a single clock buffer 16 which provides a strobe signal and a respective data memory interface 18 (although only one is shown, either a single data memory interface may be coupled to a plurality of or all of the ADCs 12 or multiple data memory interfaces and/or components provided, one for each ADC 12). In operation, each ADC 12 accepts analog input from the respective scaler 14, a sample clock from a strobe signal provided by the clock buffer 16 and outputs 8 bit gray code data to the respective data memory interface 18. The subsystem signals are either coax or ribbon interfaces that will plug directly into a printed circuit board or comparable component on which the ADCs 12 are mounted, providing for simple retrofit. The ADC printed circuit board directly interfaces to the test instruments' analog and digital interfaces.

As will be evident to one of ordinary skill in the art, the channel inputs can each be directed to a respective amplifier which links to the ADCs 12 via an analog switch. Gain and offset functions can be applied to the signals to and/or from the ADCs 12.

A programmable waveform digitizer including the ADC block 12 in accordance with the invention offers the same performance and accuracy in a low voltage environment with on-chip calibration and Built-In-Test, providing for a highly accurate, reliable and easy to maintain ADC subsystem.

Figure 4:
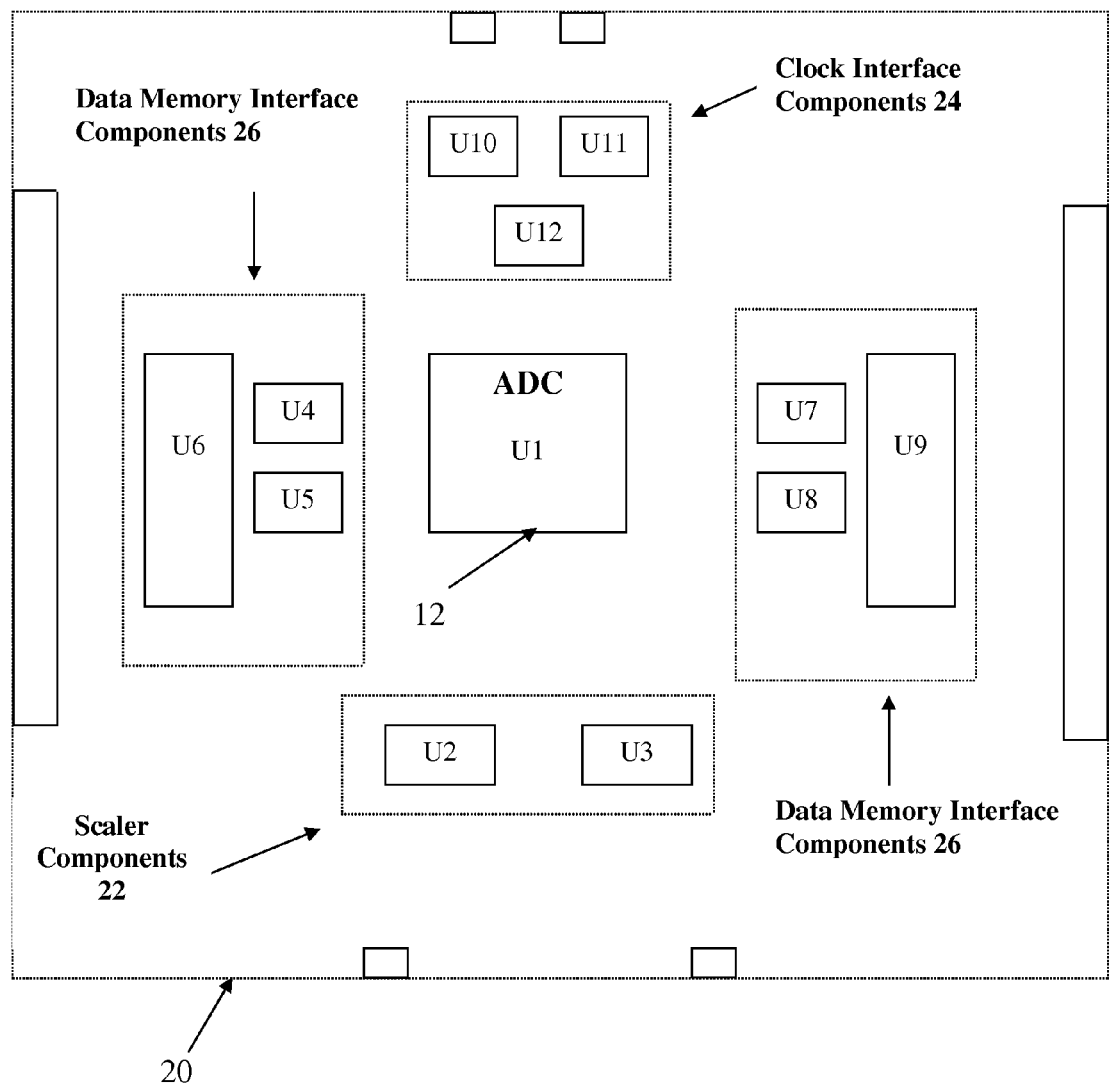
FIG. 4 is a top view of a printed circuit board containing an analog-to-digital conversion subsystem in accordance with the invention.

For example, FIG. 4 shows an exemplifying, non-limiting sketch of a printed circuit board 20 in which the various components of the ADC block 10 in accordance with the invention are schematically illustrated. The printed circuit board 20 includes an ADC 12, scaler components 22, clock interface components 24 and data memory interface components 26. Appropriate electrical wiring connecting the components 12, 22, 24, 26 are also provided but not shown.

Figure 5:
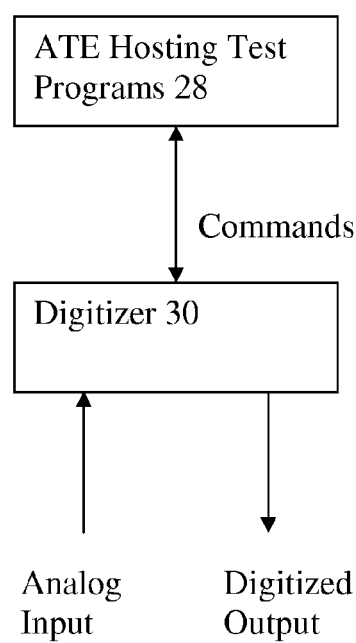
FIG. 5 is a diagram showing the environment of an obsolescence mitigation technique in accordance with the invention.

Referring now to FIG. 5, a schematic showing the environment of an obsolescence mitigation technique in accordance with the invention is shown. In some current electronic applications using a waveform digitizer 30, an automatic test equipment (ATE) hosting test programs 28 is coupled to the waveform digitizer 30 and provides commands to the digitizer 30 to execute and/or perform certain functions. Creation of the test programs often involves a considerable amount of time and effect. However, an inherent drawback of the test programs is that they are created uniquely for the waveform digitizer 30 having its specific construction, i.e., including EBS tubes (as described above). Therefore, when the waveform digitizer with EBS tubes is replaced, since it is becoming obsolete, and a new waveform digitizer is used in the same application, new test programs must be created for the new waveform digitizer, requiring time and effect.

The present invention eliminates the need to create new test programs when a waveform digitizer 30 with EBS tubes is replaced and updated. As described above, the waveform digitizer in accordance with the invention, including coupled scalers and low voltage monolithic ADC's between the analog input interface and the digital or digitized output interface is functionally equivalent to the (now obsolete) waveform digitizer with the EBS tubes, i.e., it is a form-fit-function replacement. Therefore, the same, existing test programs which were applied to the waveform digitizer with EBS tubes can still be applied to the replacement waveform digitizer, i.e., there are no changes required to the test programs in order to use the new waveform digitizer. This avoids considerable expense and effect to create new test programs when a new waveform digitizer is installed and therefore, in view of the teachings disclosed above, obsolete waveform digitizers will now be more likely to be replaced and updated.

In addition to mitigating the obsolescence of a waveform digitizer with EBS tubes, it is also contemplated that a completely new waveform digitizer may be designed to use the same, existing test programs on the ATE 28 as were used with a waveform digitizer with EBS tubes. That is, considering the combination of the ATE 28 and waveform digitizer 30 to have become obsolete, it is possible in one embodiment of the invention to design the waveform digitizer 30 to process the same commands from the test programs in the manner in which they would be processed if there were EBS tubes in the digitizer. Thus, a waveform digitizer could be designed with scalers and low-voltage monolithic ADCs to replicate the same functionality as a waveform digitizer with EBS tubes and thus an entirely new waveform digitizer would then be able to process the test programs from the ATE 28.

Thus, disclosed above is a method for replacing EBS tubes in a waveform digitizer having an analog input interface and a digital output interface, the EBS tubes being interposed between the analog input interface and the digital output interface, which method entails removing the EBS tubes and associated circuitry and componentry between the analog input interface and the digital output interface, and coupling scalers and low voltage monolithic analog-to-digital converters (ADCs) to the analog input interface and the digital output interface. In some embodiments, the ADCs may be mounted on a printed circuit board which may also include scalers arranged so that each ADC is connected to a respective scaler. Furthermore, in some embodiments, the ADCs and associated circuitry may be designed to provide on-chip calibration and a built-in test ability.

In a method for converting analog signals from a waveform digitizer into digital signals in accordance with invention without using EBS tubes, monolithic analog-to-digital converters are coupled to subsystems of the waveform digitizer which provide analog input to the ADCs, and specifically the same subsystems to which the EBS tubes are connected when present, a strobe signal is directed to the ADCs for example from a clock interface or buffer, and upon operation of the ADC's, digital output is generated and provided to a data memory interface. With this construction, the function of EBS tubes in the prior art is conveniently substituted for while disadvantages of the EBS tubes, e.g., obsolescence, are avoided.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. For example, although described primarily in method limitations, the systems shown in FIGS. 3 and 4 can be operative in and of themselves, e.g., as an attachment to or part of a waveform digitizer to render digital output signals.

The invention claimed is:

1. A method for enabling use of the same, existing test programs for both an obsolete waveform digitizer and a new waveform digitizer, each having an analog input interface and a digital output interface, comprising:
   providing an automatic test equipment (ATE) for hosting test programs for using a waveform digitizer;
   determining scalers and low voltage monolithic analog-to-digital converters (ADCs) to couple to the analog input interface and digital output interface of the new waveform digitizer such that the new waveform digitizer provides the same function as the obsolete waveform digitizer; and
   continuing use of the same, existing test programs by the ATE for the new waveform digitizer as were used for the obsolete waveform digitizer.

2. The method of claim 1, further comprising mounting the ADCs on a printed circuit board.

3. The method of claim 1, further comprising connecting each ADC to a respective scaler.

4. The method of claim 1, further comprising connecting each ADC to a respective data memory interface.

5. The method of claim 1, further comprising designing the ADCs and associated circuitry to provide on-chip calibration and a built-in testing ability.

6. The method of claim 1, wherein each ADC is a monolithic dual 8 bit ADC.

7. The method of claim 1, wherein the new waveform digitizer is constructed to be functionally equivalent to the obsolete waveform digitizer.

8. The method of claim 1, wherein the new waveform digitizer is constructed such that the functionality of the new waveform digitizer is substantially the same as the functionally of the obsolete waveform digitizer.

9. The method of claim 1, wherein the obsolete waveform digitizer included Electron Bombarded Semiconductor (EBS) tubes, further comprising constructing the new waveform digitizer without any EBS tubes.

10. A method for mitigating obsolescence of an obsolete waveform digitizer including Electron Bombarded Semiconductor (EBS) tubes, an analog input interface and a digital output interface, the EBS tubes being interposed between the analog input interface and the digital output interface, comprising:
   coupling an automatic test equipment (ATE) to the obsolete waveform digitizer;
   providing the ATE with test programs for using the obsolete waveform digitizer;
   coupling a new waveform digitizer to the ATE instead of the obsolete waveform digitizer and thus removing the obsolete waveform digitizer from coupling to the ATE;
   providing the new waveform digitizer with scalers and low voltage monolithic analog-to-digital converters (ADCs) coupled to the analog input interface and the digital output interface;
   determining the scalers and ADC's to couple to the analog input interface and digital output interface such that the scalers and ADC's in the new waveform digitizer provide the same function as the EBS tubes in the obsolete waveform digitizer; and
   continuing use of the same, existing test programs by the ATE for the new waveform digitizer as were used for the obsolete waveform digitizer.

11. The method of claim 10, further comprising mounting the ADCs on a printed circuit board.

12. The method of claim 10, further comprising connecting each ADC to a respective scaler.

13. The method of claim 10, further comprising connecting each ADC to a respective data memory interface.

14. The method of claim 10, further comprising designing the ADCs and associated circuitry to provide on-chip calibration and a built-in testing ability.

15. The method of claim 10, wherein each ADC is a monolithic dual 8 bit ADC.

16. The method of claim 10, further comprising determining the scalers and ADC's to couple to the analog input interface and digital output interface such that the same, existing test and software applications used on the obsolete waveform digitizer are usable on the new waveform digitizer.

17. The method of claim 10, wherein the new waveform digitizer is constructed to be functionally equivalent to the obsolete waveform digitizer.

18. The method of claim 10, wherein the new waveform digitizer is constructed such that the functionality of the new waveform digitizer is substantially the same as the functionally of the obsolete waveform digitizer.

19. A method utilizing an automatic test equipment (ATE) with test programs for commanding a waveform digitizer to enable use of the same, existing test programs for both an obsolete waveform digitizer and a new waveform digitizer, each having an analog input interface and a digital output interface, comprising:

determining scalers and low voltage monolithic analog-to-digital converters (ADCs) to couple to the analog input interface and digital output interface of the new waveform digitizer such that the new waveform digitizer provides the same function as the obsolete waveform digitizer; and continuing utilization of the same, existing test programs by the ATE for the new waveform digitizer as were used for the obsolete waveform digitizer.

20. The method of claim 19, wherein the new waveform digitizer is constructed to be functionally equivalent to the obsolete waveform digitizer and/or constructed such that the functionality of the new waveform digitizer is substantially the same as the functionally of the obsolete waveform digitizer.

\* \* \* \* \*